United States Patent [19]

Loomis, Jr.

[11] Patent Number: 4,495,591

[45] Date of Patent: Jan. 22, 1985

[54] PIPELINED DIGITAL FILTERS

[75] Inventor: Herschel H. Loomis, Jr., Pebble Beach, Calif.

[73] Assignee: The Regeants of the University of California, Berkeley, Calif.

[21] Appl. No.: 574,297

[22] Filed: Mar. 26, 1984

Related U.S. Application Data

[63] Continuation of Ser. No. 238,812, Feb. 27, 1981.

[51] Int. Cl.³ .......................... G06F 15/34; G06F 1/02
[52] U.S. Cl. .................................................... 364/724
[58] Field of Search .................. 364/724, 726; 370/20, 370/23, 27, 50, 70, 77, 74

[56] References Cited

U.S. PATENT DOCUMENTS

| 3,829,670 | 8/1974 | Kebabian | 364/724 |
| 3,955,193 | 5/1976 | Koffler et al. | 364/724 |
| 4,317,092 | 2/1982 | Potter | 364/724 X |

OTHER PUBLICATIONS

G. D. Papadopoulos, "The Radio Electronics Engineer", pp. 643–648, Dec. 1979.

Primary Examiner—Thomas M. Heckler
Assistant Examiner—Tim A. Wiens
Attorney, Agent, or Firm—Fliesler, Dubb, Meyer & Lovejoy

[57] ABSTRACT

A digital filter having a recursive portion and a non-recursive portion. The digital filter is implemented using pipelining techniques and parallel arithmetic and parallel arithmetic in both portions.

7 Claims, 9 Drawing Figures

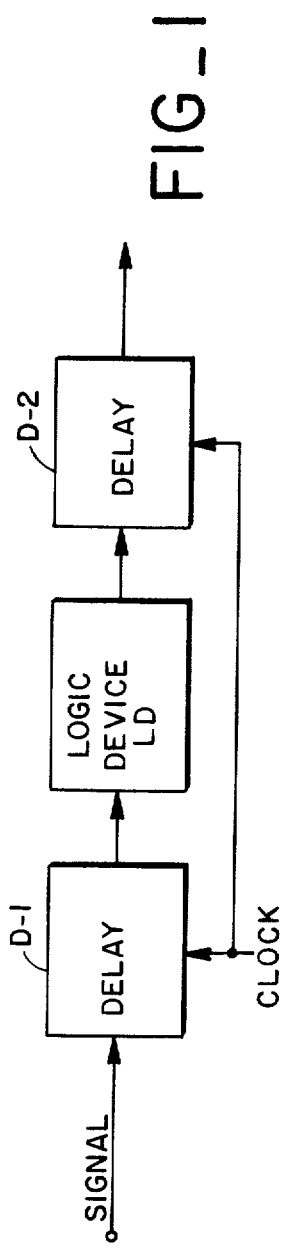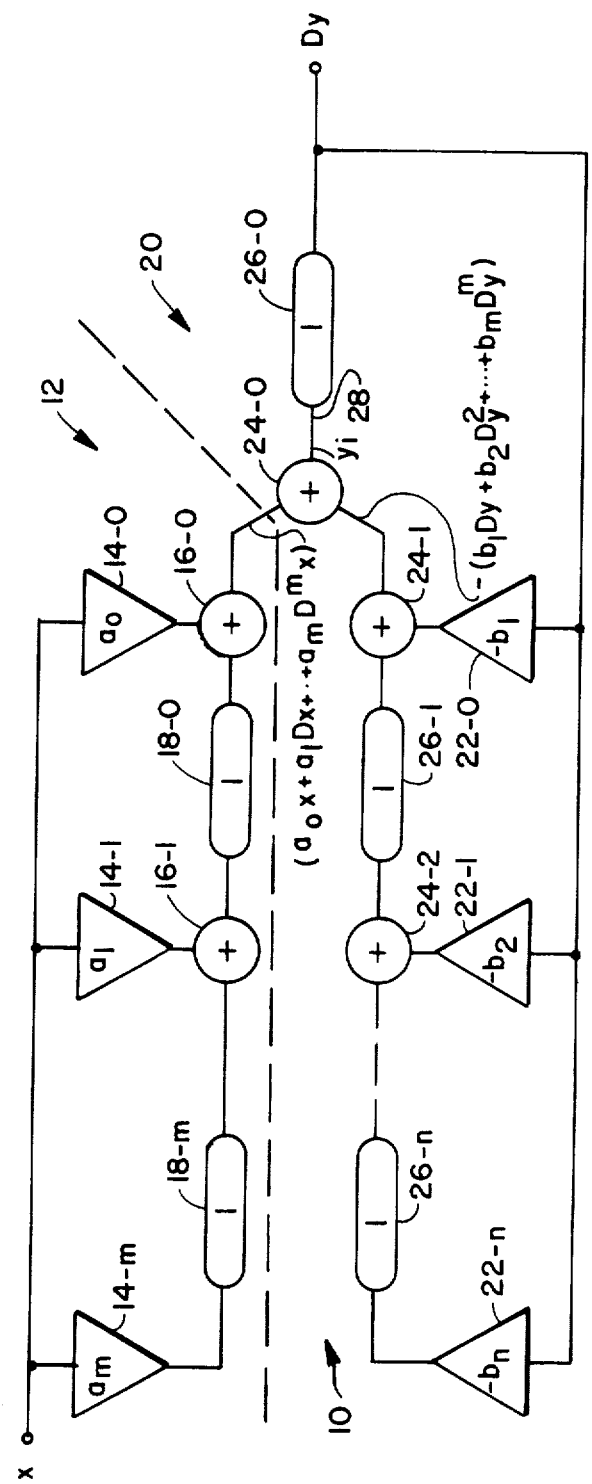

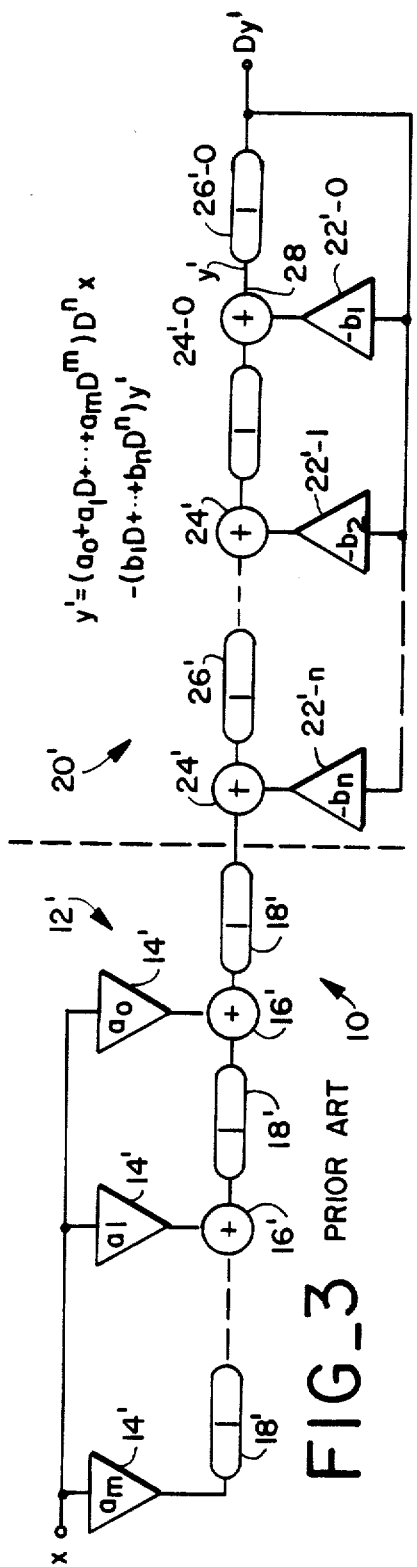
FIG._3 PRIOR ART
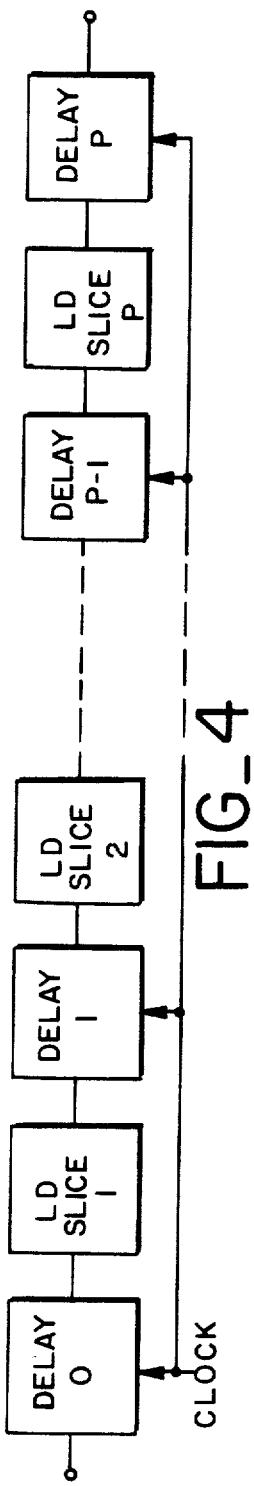
FIG._4
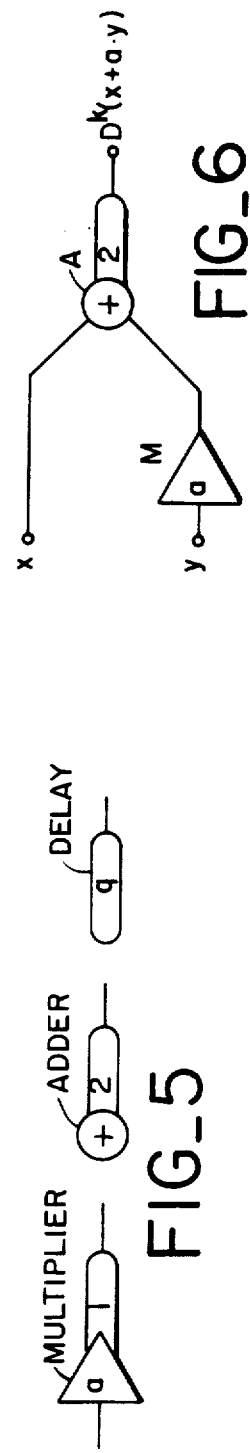
FIG._5
FIG._6

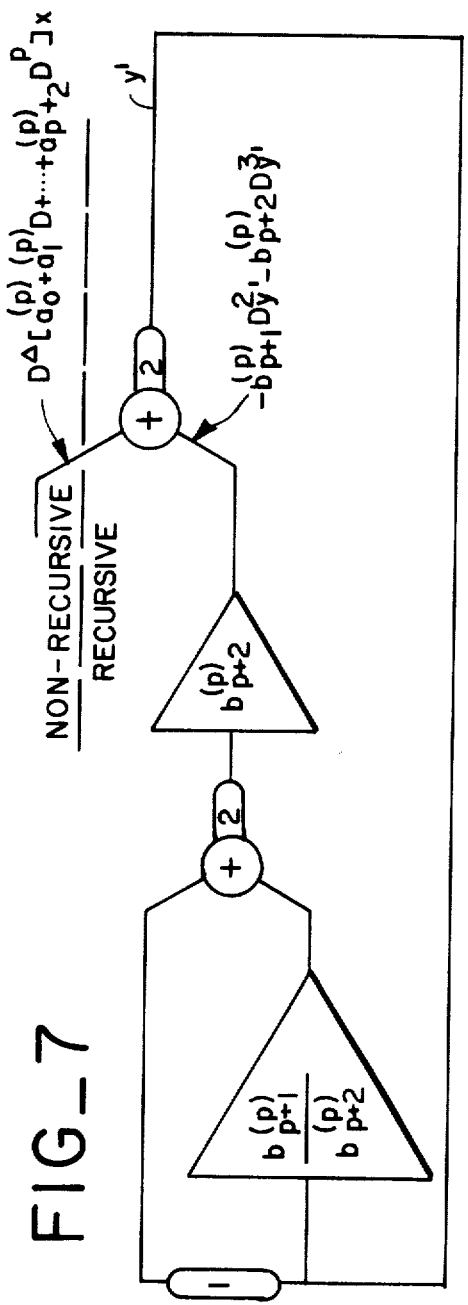
FIG_7
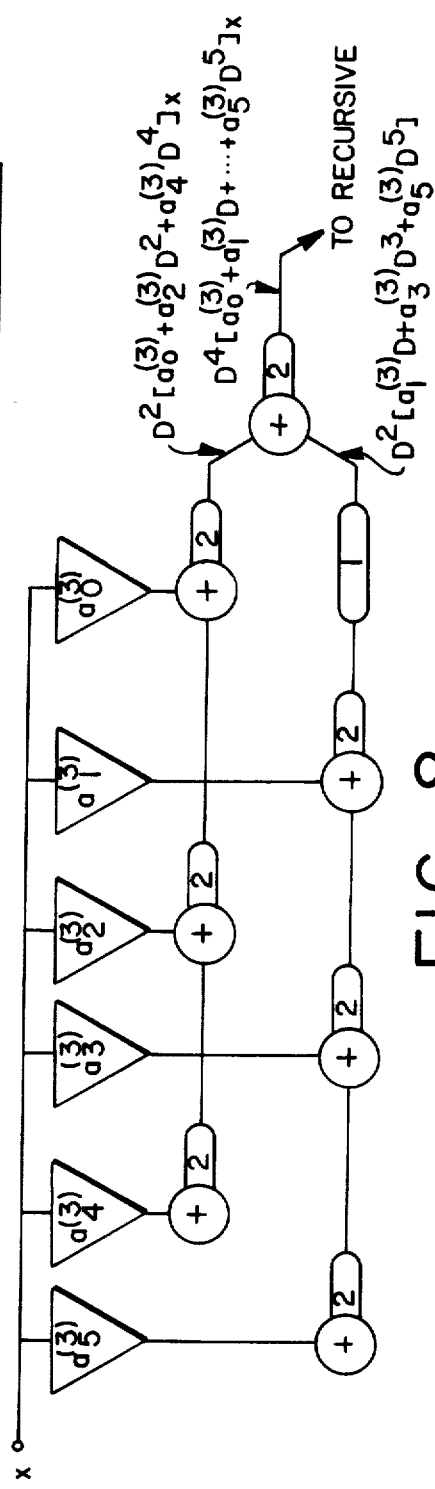
FIG_8

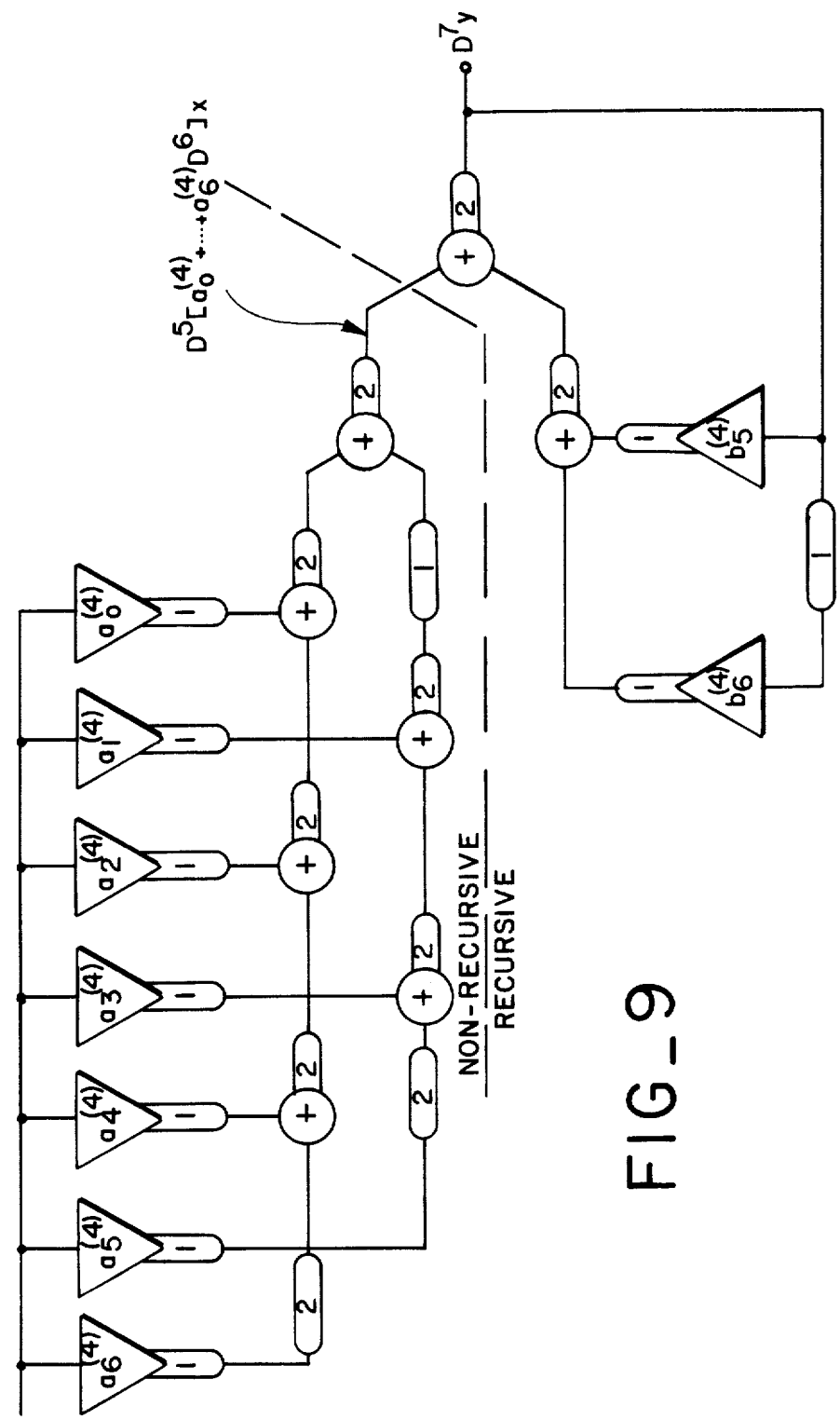
FIG_9

PIPELINED DIGITAL FILTERS

This is a continuation of Ser. No. 238,812, filed Feb. 27, 1981.

BACKGROUND OF THE INVENTION

This invention relates to digital signal processing devices and, more particularly, to digital filters.

A digital filter is a device which operates digitally on digital representations of an analog signal that is sampled at specific instances of time. In an overall filtering process, an analog-to-digital converter periodically samples the analog signal and encodes the sample into digital signals. A digital filter then processes the digital signals, after which the processed digital signals are converted back to the analog signal by a digital-to-analog converter. In accordance with the well-known sampling theorem, the sampling frequency must be equal to or greater than twice the highest frequency component of the analog signal being sampled to reconstruct the analog signal with all of its frequency components and without distortion due to aliasing. Digital filters, in general, have many advantages over analog filters, such as cost and the ability to realize filter functions that are difficult to realize in the analog domain.

Digital filters typically are constructed of logic devices such as multipliers and adders, and respond to a clock frequency signal which is used to process the digital signals through the filters. Digital filters can have a non-recursive portion, in which the output signals are not fed back to the input, and a recursive portion, which processes the output signals fed back to the recursive portion, to perform the filtering functions. The maximum clock frequency, and hence maximum speed of the digital filters, is limited by the physical delays introduced by such logic devices and the complexity of the filtering function being implemented. The longer the physical delays introduced by a particular multiplier or adder, and/or the greater number of logic devices needed to implement a more complex function, i.e., the more complex the logic design, the lower the clock frequency.

In a given overall filtering process, the clock frequency equals the sampling frequency and, ideally, both are identical to the theoretical sampling frequency. However, if the analog signal has very high frequency components, the limitations imposed by the construction and complexity of the digital filters usually prevent achieving a clock frequency as high as the theoretical rate. Consequently, the sampling frequency may have to be reduced below the theoretical sampling frequency because of the maximum clock frequency of the digital filters. Alternatively, the sampling can occur at the theoretical rate, but high speed filtering cannot be serviced. Thus, digital filters may have the disadvantage of preventing reconstruction of the analog signal with all of its frequency components.

Two approaches to reducing this problem are using multipliers and adders which produce less physical delay in processing the digital signals and/or simplifying the logic design implementing the filtering function. The former may not be likely due to the state-of-the-art of these devices, and the latter may not be possible or may be extremely difficult.

SUMMARY OF THE INVENTION

It is an object of the invention to provide novel digital filters.

Another object of the present invention is to increase the speed of digital filters implemented with state-of-the-art logic devices and which is independent of the complexity of the filtering function.

The above and other objects of the present invention are obtained through the use of a digital filter having a non-recursive portion and a recursive portion, wherein the filter has a function $$y = a_0 + a_1 D^1 x + a_2 D^2 x + \ldots + a_m D^m x + b_1 D^1 y + \ldots + b_n D^n y$$

in which x is a sampled input signal, y is an output signal, and the terms containing $a_0, a_1 \ldots a_m$ represent the non-recursive portion and $a_0, a_1 \ldots a_m$ are constants, and the terms containing $b_1 \ldots b_n$ represent the recursive portion and $b_1 \ldots b_n$ are constants, and wherein said digital filter operates at a clock frequency $f_s$, said clock frequency $f_s$ also being the frequency at which the input signal is sampled, said nonrecursive portion and said recursive portion each having digital logic means for multiplying digital signals by said constants and for adding two digital signals and for delaying digital signals by one clock period, the improvement comprising: said digital logic means of said non-recursive portion and said recursive portion having a pipelined implementation providing a function $y'$ which is operationally the same as the function y, but delayed by d sample times, and being operable at a clock frequency $f_s'$ which is higher than $f_s$.

BRIEF DESCRIPTION OF THE DRAWINGS

FIG. 1 is a block diagram of components of a conventional digital filter.

FIG. 2 illustrates a block diagram of a conventional digital filter.

FIG. 3 shows a block diagram of a conventional improvement of the digital filter of FIG. 2.

FIG. 4 is an illustration used to explain pipelining.

FIG. 5 shows pipelining modules.

FIG. 6 illustrates a 2-stage pipelined multiply-add unit.

FIG. 7 is block diagram of a recursive portion of a digital filter of the present invention.

FIG. 8 shows a block diagram of a non-recursive portion of a digital filter of the present invention.

FIG. 9 illustrates another implementation of a digital filter of the present invention.

DETAILED DESCRIPTION OF THE INVENTION

FIG. 1 shows generally components that can be a part of any digital filter. A delay D-1 and a delay D-2 are clocked with a clock frequency signal, and a logic device LD receives and processes the output of delay D-1 to the input of delay D-2. As will be further described, delay D-1 and delay D-2 introduce functional or operational delays and can comprise flip-flops which form registers that are used to save digital signals temporarily and to resynchronize these digital signals with the clock frequency signal as the digital filtering process occurs. Logic device LD introduces physical delays as the digital filtering process occurs and can comprise, for example, a multiplier or an adder.

FIG. 2 illustrates a conventional digital filter 10 which operates on digital representations or signals x of an analog signal sampled at specific instances of time. Digital filter 10 includes a non-recursive portion 12, having logic devices LDs such multipliers 14-O, 14-1 . . . 14-m which multiply digital signals by constants $a_0, a_1 \ldots a_m$, adders 16-O, 16-1, etc. which add two digital signals, and delays D such as registers 18-O . . . 18-m producing functional or operational delays of 1 sample time. Digital filter 10 also has a recursive portion 20 having logic devices LDs such as multipliers 22-O, 22-1 . . . 22-n which multiply digital signals by constants $b_1, b_2 \ldots b_n$, adders 24-O, 24-1, etc. which add two digital signals, and delays D such as registers 26-O, 26-1 . . . 26-n producing functional or operational delays of 1 sample time.

The structure of and operations performed by the digital filter 10 can be expressed by a general form of difference equation (1) or by its transfer function (2) in Z-transform notation:

$$y_i = (a_0 x_i + a_1 x_{i-1} + a_2 x_{i-2} + \ldots + a_m x_{i-m}) - \quad (1)$$

$$(b_1 y_{i-1} + b_2 y_{i-2} + \ldots + b_n y_{i-n})$$

$$y = \frac{(a_0 + a_1 z^{-1} + a_2 z^{-2} + \ldots a_m z^{-m})}{(1 + b_1 z^{-1} + b_2 z^{-2} + \ldots + b_n z^{-n})} x \quad (2)$$

In equation (1) subscript i on the variable x and the variable y indicates the $i^{th}$ sample time. Thus, $x_i$ means the value of x at the $i^{th}$ sample time, $x_{i-1}$ means the value of x at the $(i-1)^{st}$ sample time, i.e., $x_i$ delayed by a register 18 by 1 sample time, etc., and similarly for $y_i$. In equation (2), symbols $z^{-n}$ or $z^{-m}$ also mean delay by n or m multiplies of 1 sample time so that equation (1) can be rewritten using $z^{-n}$ and $z^{-m}$, as follows:

$$y = (a_0 x + a_1 z^{-1} x + a_2 z^{-2} x + \ldots + a_m z^{-m} x) - (b_1 z^{-1} y + b_2 z^{-2} y + \ldots + b z^{-n} y) \quad (3)$$

Another way of representing the structure of digital filter 10 is to express difference equation (1) using a delay operator $D^k$ to express the operation of delaying by k sample times in which $D^k$ is equivalent to $z^{-k}$ where k is an integer between 0 and the greater of m or n in the z-transform equation (3). When written in terms of the delay operator $D^k$, equations (1) and (3) become:

$$y = (a_0 x + a_1 D x + a_2 D^2 x + \ldots + a_m D^m x) - (b_1 D y + b_2 D^2 y + \ldots + b_n D^n y) \quad (4)$$

With reference to FIG. 1 and FIG. 2, the interval between sampling times of the analog signal, i.e., the sampling interval, also is the period of the digital filter clock frequency that drives the delays D or registers 18, 26. The minimum value for this clock period is determined by the maximum physical delay encountered by the digital signals being processed by a logic device LD between the output of one delay D-1 and the input of another delay D-2. This minimum value for the clock period is determined by the inequality (5), which must be satisfied for the overall filtering process to operate properly:

$$1/f_s = T_s \geq max\ (t_{ff} + t_s + kt_{pd}) \quad (5)$$

where $T_s$ is the clock period or sampling period, $f_s$ is the sampling frequency, $t_{ff}$ is the delay by a flip-flop of a delay D in responding to an edge of a pulse of the digital clock, $t_s$ is the set-up time for such a flip-flop, k represents the complexity of a logic device LD between two delays D-1, D-2 and $kt_{pd}$ is the maximum physical delay produced by such a logic device LD in processing a digital signal between its input and its output. In the digital filter 10 of FIG. 2, the most logic devices LDs between delays D, and hence longest physical delay, are encountered in the signal path between the filter output carrying a signal Dy, through the $-b_1$ multiplier 22-0, then through two adders 24-1, 24-0 to a line 28 which is the input to a register 26-0 whose output is signal Dy.

As described previously, the well-known sampling theorem specifies that the sampling frequency $f_s$ should be equal to or greater than twice the highest frequency component of interest in the analog signal being sampled. Because the clock period $T_s$ also is the reciprocal of the sampling frequency $f_s$, the former determines the maximum frequency component in the analog signal that is sampled. If an analog signal with higher frequency components is to be processed by digital filter 10, then sampling frequency $f_s$ must be increased proportionally. Since the parameters of the logic devices LDs and delays D contained in equation (4) determine sampling frequency $f_s$, once the smallest values of $t_{ff}, t_s$ and $t_{pd}$ are selected, the prior technique for increasing sampling frequency $f_s$ is to reduce, if possible, the complexity k of the logical design implementing the filtering function.

FIG. 3 shows a digital filter 10' which is operationally equivalent to digital filter 10 and which might be implemented using prior techniques to simplify the logical design. Digital filter 10' is less complex than digital filter 10 since there is only one multiplier 22'-0 and one adder 24'-0 in the signal path of the filter output signal Dy' through the $-b_1$ multiplier 22'-0, then through adder 24'-0 to a line 28' which is the input to a register 26'-0. This is in contrast to the two adders 24-1, 24-0 shown in the similar signal path for digital filter 10. The sampling frequency $f_s$ that may be used in relation to digital filter 10' may be raised by a factor of about 1.5 to 1.8 over the sampling frequency $f_s$ used in relation to digital filter 10.

To show, mathematically, the operational equivalency of digital filter 10' and digital filter 10, the function y' on line 28' produced by the former has the equation (6):

$$y' = (a_0 + a_1 D + \ldots + a_m D^m)\ D^n x - (b_1 D + b_2 D^2 + \ldots + b_n D^n) y' \quad (6)$$

Now, if $D^n y$ is substituted for y' in (6), the following is obtained:

$$D^n y = (a_0 + \ldots + a_m D^m) D^n x - (b_1 D + b_2 D^2 + \ldots + b_n D^n) D^n y \quad (7)$$

If both sides of equation (7) are divided by $D^n$, the result is equation (4) for y, i.e., for digital filter 10, in which y is delayed by n sample periods.

The present invention, rather than increasing the sampling frequency $f_s$ by reducing the complexity of a digital filter having a given function, employs pipelining techniques used in other digital processing networks to digital filters, as now will be described.

As already indicated in FIG. 1, the clock frequency is a measure of the speed of digital filters. The delay D-1 and delay D-2 are clocked by a single clock and the throughput of the combination shown in FIG. 1 is simply the clock frequency controlling the operation of delay D-1 and delay D-2. The clock frequency, as already described, is governed by the maximum delay given by equation (5).

In accordance with the present invention, the throughput or speed of any digital filter is improved by employing pipelining techniques. More specifically, as shown in FIG. 4, the logic device LD, for example, a multiplier 22, is cut into p logic slices such that the physical delay between any input to and dependent output from a given slice p is no greater than $(k/p)t_{pd}$. Then, delays D, for example, registers 26, are inserted into each of the p-1 cuts used to produce the logic slices p. Since the maximum physical delay found in any slice p is $(k/p)t_{pd}$, then the maximum clock frequency is given by equation (8):

$$\frac{1}{f_s} = T_s \geq \max\left(t_{ff} + \frac{k}{p} t_{pd} + t_s\right) \tag{8}$$

Equation (8) shows that if the physical delay $(k/p)t_{pd}$ dominates the functional or operational delay produced by the registers then $$f_s \cong \left(\frac{p}{k}\right) \frac{1}{t_{pd}}.$$

Consequently, the clock frequency is approximately directly proportional to the number of pipeline stages p. Thus, by pipelining a digital filter, a substantial increase in clock frequency can be obtained, which means an increased sampling frequency and hence the application of a digital filter to analog signals having higher frequency components.

A specific example of the present invention will now be described for a second-order filter, that is m=2, though the principles can be applied to higher order filters. For the second-order digital filter, equation (4) can be written as:

$$y = (a_o + a_1 D + a_2 D^2)x - (b_1 D + b_2 D^2)y \tag{9}$$

If the polynominal $(a_o + a_1 D + a_2 D^2)x$ is substituted by x', then equation (9) becomes:

$$y = x' - (b_1 D + b_2 D^2)y \tag{10}$$

Now, by delaying equation (10) by D and substituting for Dy in equation (10) the following results:

$$y = x' - b_1(Dx' - b_1 D^2 y - b_2 D^3 y) - b_2 D^2 y \tag{11}$$

or $$y = (1 - b_1 D)x' - [(-b_1^2 + b_2)D^2 y - b_1 b_2 D^3 y] \tag{12}$$

Equation (12) is now a third-order difference equation describing the same second-order digital filter. That is, the second-order digital filter described by equation (9) or (10) has the same transfer function as the digital filter described by equation (11) or (12).

Now delaying equation (10) by $D^2$ and substituting for Dy into equation (10) yields:

$$y = [1 - b_1 D + (b_1^2 - b_2)D^2]x' - [(-2b_1 b_2 + b_1^3)D^3 y + (-b_2^2 + b_1^2 b_2)D^4 y] \tag{13}$$

In general, successively more delayed versions of equation (10) can be substituted, raising the order of the difference equation, but, more importantly, raising also the minimum delay associated with the fedback terms y in the recursive portion of the digital filter. The general higher order difference equation has the following general form, starting from a second-order equation:

$$y = [1 + a_1^{(p)} D + a_2^{(p)} D^2 + \ldots + a_p^{(p)} D^p]x' - [b_{p+1}^{(p)} D^{p+1} y + b_{p+2}^{(p)} D^{p+2} y] \tag{14}$$

In fact, the general higher order difference equation has the following general form, starting from an $n^{th}$ order difference equation:

$$y = [1 + a_1^{(p)} D + \ldots + a_p^{(p)} D^p]x' - [b_{p+1}^{(p)} D^{p+1} y + \ldots + b_{p+n}^{(p)} D^{p+n} y] \tag{15}$$

From equation (13), it can be seen that $$a_1^{(2)} = -b_1;\ a_2^{(2)} + b_1^2 - b_2$$

$$b_3^{(2)} = -2b_1 b_2 + b_1^3;\ b_4^{(2)} = -b_2^2 + b_1^2 b_2$$

where the b coefficients are taken from equation (10) Now, as described above in that $$x' = (a_o + a_1 D + a_2 D^2)x$$

and substituting x' into equation (14), the result is:

$$y = [1 + a_1^{(p)} D + \ldots + a_p^{(p)} D^p][a_o + a_1 D + a_2 D^2]x - [b_{p+1}^{(p)} D^{p+1} y + b_{p+2}^{(p)} D^{p+2} y] \tag{16}$$

$$y = [a_o^{(p)} + a_1^{(p)} D + \ldots + a_{p+2}^{(p)} D^{p+2}]x - [b_{p+1}^{(p)} D^{p+1} y + b_{p+2}^{(p)} D^{p+2} y] \tag{17}$$

where the terms in brackets multiplying x in equation (17) represent the product of the terms in brackets multiplying x in equation (16).

Before describing particular realizations of digital filters having pipelined implementations in accordance with the present invention, reference should be made to FIG. 5, which shows conventional pipeline notation or modules, and to FIG. 6 which shows a simple example of a 2-stage pipeline multiply-add unit used in such realizations. FIG. 5 shows a 1-stage multiplier M, a 2-stage adder A, and a functional or q stage delay D where q represents the number of stages in the multiplier M or adder A. FIG. 6 illustrates the 2-stage pipeline multiply-add unit having a 2-stage adder A and a multiplier M.

The 2-stage multiply-add unit of FIG. 6 takes two digital signals x and y and produces an output $D^2(x + ay)$, where $D^2$ shows the effect of 2 operational delays introduced by the 2 stages of adder A.

FIG. 7 illustrates a recursive portion of a digital filter having a pipelined implementation that is realized from the recursive portion of equation (17) and which uses a 2-stage multiply-add unit from FIG. 6. The recursive portion of FIG. 7 produces a characteristic equation (18) for a fifth-order digital filter which has been manipulated to be of the form of equation (17):

$$y' = D^2 D^\Delta [a_o^{(p)} + a_1^{(p)} D + \ldots + a_{p+2}^{(p)} D^{(p+2)}]x - [b_{p+1}^{(p)} D^4 y' + b_{p+2}^{(p)} D^5 y'] \tag{18}$$

Equation (18) has the same basic form as equation (17), and the differences can be eliminated by first recognizing that equation (17) is a p+2-order digital filter, while equation (18) represents a 5th-order digital filter. Therefore, equations (17) and (18) can be rewritten for the case of p+2=5 or p=3.

$$y = [a_0^{(3)} + a_1^{(3)}D + \ldots + a_5^{(3)}D^5]x - [b_4^{(3)}D^4y + b_5^{(3)}D^5y] \quad (17a)$$

$$y' = D^2D^\Delta[a_0^{(3)} + a_1^{(3)}D + \ldots + a_5^{(3)}D^5]x - [b_4^{(3)}D^4y' + b_5^{(3)}D^5y'] \quad (18a)$$

Equations (17a) and (18a) are similar, the only difference being that the non-recursive portion of equation (18a) is the non-recursive portion of equation (17a) delayed by $\Delta + 2$. Now, if both sides of equation (17a) are delayed by $\Delta + 2$, then $$D^{\Delta+2}y = D^{\Delta+2}[a_0^{(3)} + a_1^{(3)}D + \ldots + a_5^{(3)}D^5]x - [b_4^{(3)}D^{\Delta+6} + b_5^{(3)}D^{\Delta+7}y] \quad (17b)$$

Finally, it can be seen that $D^{\Delta+2}y$ in equation (17b) is the same as $y'$ in equation (18a). Therefore, substituting $D^{\Delta+2}y = y'$ in equation (17b) produces $$y' = D^{\Delta+2}[a_0^{(3)} + a_1^{(3)}D + \ldots + a_5^{(3)}D^5]x - [b_4^{(3)}D^4y' + b^{(3)}D^5y'] \quad (17c)$$

which is the same as equation (18a).

The significance of the above is that the digital filter of FIG. 7 showing the recursive portion, will produce output $y'$, which simply is the desired output $y$, delayed by $\Delta + 2$ sampling periods. FIG. 8 shows the non-recursive portion of the digital filter implementing non-recursive portion of equation (17b). This non-recursive portion produces $D^4[a_0^{(3)} + a_1^{(3)}D + \ldots + a_5^{(5)}]x$ require as the output of the non-recursive portion of FIG. 7. Therefore, the digital filter of FIGS. 7 and 8, having pipelining in the non-recursive and recursive portions, can be combined to produce $D^{4+2}y$, that is, $y$ delayed by 6 sample periods.

The coefficients of the pipelined digital filter of FIGS. 7-8 based on the original 2nd order difference equation shown in equation (9) are given in the following table for p=3:

non-recursive portion $$a_0^{(3)} = a_0$$
$$a_1^{(3)} = a_1 - a_0b_1$$
$$a_2^{(3)} = a_2 - a_1b_1 + a_0b_1^2 - a_0b_2$$
$$a_3^{(3)} = -a_2b_1 + a_1b_1^2 - a_1b_2 - a_0b_1^3 + 2a_0b_1b_3$$
$$a_4^{(3)} = a_2b_1^2 - a_2b_2 - a_1b_1^3 + 2a_1b_1b_3$$
$$a_5^{(3)} = -a_2b_1^3 + 2a_2b_1b_2$$

recursive portion $$b_4^{(3)} = b_1^5 - 4b_1^3b_2 + 3b_1b_2^2$$
$$b_5^{(3)} = b_1^4b_2 - 3b_1^2b_2^2 + b_2^3$$

Thus, from all of the above, a significant aspect of digital filters of the present invention is contained in the recursive portion, where the feedback loop involving the longest delay passes through p+2 pipeline stages for the realization of a 2nd order filter.

A wide variety of similar digital filters having pipelining now can be realized. A change in the basic pipeline module or number of stages would result in a final realization, as would starting from a different order filter to be realized. For example, FIG. 9 shows a 6th order pipeline realization of a 2nd order digital filter using a 1-stage multipler and a 2-stage adder, along with operational delays, as the basic pipeline modules.

Other aspects, objects and advantages of this invention can be obtained from a study of the drawings, the disclosure and the appended claims.

What is claimed is:

1. An improvement in a digital filter having a non-recursive portion and a recursive portion, wherein said digital filter has a function $y = a_0x + a_1D^1x + a_2D^2x + \ldots a_mD^mx - (b_1D^1 + \ldots + b_nD^ny)$, in which the terms containing $a_m$ represent the non recursive portion and $a_0, a_1 \ldots a_m$ are constants, the terms containing $b_1 \ldots b_n$ represent the recursive portion and $b_1 \ldots b_n$ are constants, and $D^m$ and $D^n$ are delay operators, and wherein said digital filter operates at a clock frequency $f_s$, said clock frequency $f_s$ also being the frequency at which an input signal x to said digital filter has been sampled, said non-recursive portion and said recursive portion each having at least one 1-stage parallel multiply-add means with one stage for multiplying digital signals by said constants and for adding two digital signals and for delaying digital signals by one clock period, wherein the improved digital filter comprises:
   (a) said parallel muyltiply-add means in said recursive portion including parallel pipeline multiply-add means with more than one stage for multiplying digital signals by said constants and for adding two digital signals.
   (b) said improved digital filter providing a higher order function which is operationally the same as said function y but delayed by a number D of sample times; and
   (c) said improved digital filter being operable at a clock frequency which is greater than $f_s$ and determined by the number of stages in said parallel pipeline multiply-add means.

2. An improved digital filter according to claim 1, wherein each stage of said parallel pipeline multiply-add means comprises a multiplier and an adder, in which either or both have a pipeline implementation.

3. An improved digital filter according to claim 1, wherein said recursive portion implementing said function y has a feedback path having a minimum delay D of 1 sample time and wherein said recursive portion implementing said higher order function has a minimum delay D of more than one sample time.

4. An improved digital filter according to claim 3, wherein said minimum delay D is dependent on the degree of pipelining and the topology of said recursive portion implementing said higher order function.

5. An improved digital filter according to claim 1, wherein said parallel pipeline multiply-add means comprises at least a 2-stage multiplier-adder.

6. An improved digital filter according to claim 5, wherein said 2-stage multiplier-adder comprises a 1-stage multiplier and 2stage adder.

7. A digital filter performing a function defined by the p-order equation, $y = (a_0x + a_1D^1x + a_2D^2x + \ldots a_nD^nx) - (b_1D^1 + b_2D^2y + \ldots b_mD^my)$ in which the terms containing coefficients $a_0, a_1 \ldots a_n$ define the non-recursive portion, and the terms containing the coefficients $b_0, b_1 \ldots b_m$ define the recursive portion, and $D^m$ and $D^n$ are delay operators, where p equals the greater of m or n, said digital filter comprising:

recursive means for parallel pipeline implementation of the recursive portion including a plurality of feedback loops, said plurality of feedback loops having a minimum number q greater than one of pipeline stages and corresponding to the terms of the recursive portion;

non-recursive means for parallel pipeline implementation of the non-recursive portion including a plurality of pipeline paths;

said plurality of pipeline paths having a minimum of said number q of pipeline stages and corresponding to the terms of the non-recursive portion;

output means for combining said recursive means and said non-recursive means to implement a (p+q)-order difference equation having an output equivalent to the p-order difference equation y.

* * * * *

UNITED STATES PATENT AND TRADEMARK OFFICE
CERTIFICATE OF CORRECTION

PATENT NO. : 4,495,591

DATED : January 22, 1985

INVENTOR(S) : Herschel H. Loomis, Jr.

It is certified that error appears in the above-identified patent and that said Letters Patent is hereby corrected as shown below:

Column 2, line 19 should read "the non-recursive portion and $a_0, a_1 \ldots a_m$ are constants,"

Column 3, line 38, equation (3) should read:
$$y = (a_0 x + a_1 z^{-1} x + a_2 z^{-2} x + \ldots + a_m z^{-m} x) - (b_1 z^{-1} y + b_2 z^{-2} y + \ldots + b_n z^{-n} y)$$

Column 6, line 21, after "$a_2^{(2)}$", change "+" to "=".

Column 6, line 33, after "$[b_{p+1}^{(p)}$", equation should read
$$D^{p+1} y + b_{p+2}^{(p)} D^{p+2} y]$$

UNITED STATES PATENT AND TRADEMARK OFFICE
CERTIFICATE OF CORRECTION

PATENT NO. : 4,495,591
DATED : January 22, 1985
INVENTOR(S) : Herschel H. Loomis, Jr.

It is certified that error appears in the above-identified patent and that said Letters Patent is hereby corrected as shown below:

Column 6, line 36, after "$[b_{p+1}{}^{(p)}$", equation should read $$D^{p+1}y + b_{p+2}{}^{(p)} D^{p+2}y]$$

Column 8, line 14, change "$b_1 D^1$" to "$b_1 D^1 y$".

Column 8, line 29 change "muyltiply-add" to "multiply-add".

Column 8, line 65, change "$b_1 D^1$" to "$b_1 D^1 y$".

Signed and Sealed this

Thirteenth Day of August 1985

[SEAL]

Attest:

DONALD J. QUIGG

Attesting Officer

Acting Commissioner of Patents and Trademarks